United States Patent
Richter et al.

(10) Patent No.: US 10,825,961 B2
(45) Date of Patent: Nov. 3, 2020

(54) METHOD OF PRODUCING OPTOELECTRONIC COMPONENTS AND OPTOELECTRONIC COMPONENT

(71) Applicant: OSRAM Opto Semiconductors GmbH, Regensburg (DE)

(72) Inventors: Markus Richter, Burglengenfeld (DE); Christian Gatzhammer, Lupburg (DE)

(73) Assignee: OSRAM OLED GmbH, Regensburg (DE)

(*) Notice: Subject to any disclaimer, the term of this patent is extended or adjusted under 35 U.S.C. 154(b) by 0 days.

(21) Appl. No.: 16/205,412

(22) Filed: Nov. 30, 2018

(65) Prior Publication Data

US 2019/0172979 A1    Jun. 6, 2019

(30) Foreign Application Priority Data

Dec. 4, 2017 (DE) .................. 10 2017 128 717

(51) Int. Cl.
| | |
|---|---|
| *H01L 33/48* | (2010.01) |
| *H01L 31/18* | (2006.01) |
| *H01L 31/0203* | (2014.01) |
| *H01L 33/52* | (2010.01) |
| *H01L 33/54* | (2010.01) |
| *H01L 33/56* | (2010.01) |
| *H01L 29/66* | (2006.01) |
| *H01L 29/417* | (2006.01) |
| *H01L 33/50* | (2010.01) |
| *H01L 33/62* | (2010.01) |

(52) U.S. Cl.
CPC ........ *H01L 33/483* (2013.01); *H01L 31/0203* (2013.01); *H01L 31/18* (2013.01); *H01L 33/52* (2013.01); *H01L 29/41791* (2013.01); *H01L 29/66795* (2013.01); *H01L 33/486* (2013.01); *H01L 33/505* (2013.01); *H01L 33/54* (2013.01); *H01L 33/56* (2013.01); *H01L 33/62* (2013.01); *H01L 2933/005* (2013.01); *H01L 2933/0033* (2013.01)

(58) Field of Classification Search
CPC ... H01L 33/483; H01L 33/52; H01L 31/0203; H01L 31/18; H01L 2933/005; H01L 33/486; H01L 33/56; H01L 33/54; H01L 2933/0033; H01L 2933/0041; H01L 33/505; H01L 33/62
See application file for complete search history.

(56) References Cited

U.S. PATENT DOCUMENTS

| | | |
|---|---|---|
| 2015/0070909 A1 | 3/2015 | Jung et al. |
| 2017/0062671 A1 | 3/2017 | Hashimoto et al. |
| 2018/0094796 A1* | 4/2018 | Hayashi ................ F21V 17/101 |

* cited by examiner

*Primary Examiner* — Patricia D Reddington
(74) *Attorney, Agent, or Firm* — DLA Piper LLP (US)

(57) ABSTRACT

A method of producing an optoelectronic component includes providing a carrier, generating a plurality of recesses in the carrier, applying a plurality of drops of a cover material to the carrier, introducing an optoelectronic semiconductor chip including a semiconductor body and contact elements on an underside of the semiconductor body into at least some of the drops, and curing the drops of the cover material into cover bodies, wherein at least some of the drops are completely surrounded by recesses in the carrier, and the recesses in the carrier are a stop edge for the cover material during introduction of the optoelectronic semiconductor chip.

10 Claims, 5 Drawing Sheets

METHOD OF PRODUCING OPTOELECTRONIC COMPONENTS AND OPTOELECTRONIC COMPONENT

TECHNICAL FIELD

This disclosure relates to a method of producing an optoelectronic component and an optoelectronic component.

BACKGROUND

There is a need to provide a method with which an optoelectronic component can be produced in a particularly cost-effective manner as well as a corresponding component.

SUMMARY

We provide a method of producing an optoelectronic component including providing a carrier, generating a plurality of recesses in the carrier, applying a plurality of drops of a cover material to the carrier, introducing an optoelectronic semiconductor chip including a semiconductor body and contact elements on an underside of the semiconductor body into at least some of the drops, and curing the drops of the cover material into cover bodies, wherein at least some of the drops are completely surrounded by recesses in the carrier, and the recesses in the carrier are a stop edge for the cover material during introduction of the optoelectronic semiconductor chip.

We also provide an optoelectronic component including an optoelectronic semiconductor chip including a semiconductor body and contact elements on an underside of the semiconductor body, and a cover body formed with a radiation-transmissive material, wherein the cover body covers side surfaces of the semiconductor body, the cover body terminates flush with the underside of the semiconductor body, the cover body wets the semiconductor body at least in places on an upper side facing away from the underside, and the cover body is shaped convexly on a side facing away from the side surfaces of the semiconductor body.

LIST OF REFERENCE NUMERALS 1 carrier
2 foil
2a underside foil
3 temporary carrier
4 saw blade
5 recess
6 mounting region
7 cover material
7A cover material of the quantity A
7B cover material of quantity B
7c outer surfaces cover material
8 optoelectronic semiconductor chip
8b upper side of optoelectronic semiconductor chip
9 semiconductor body
9a underside side of semiconductor body
9b upper side of semiconductor body
9c side surfaces semiconductor body
9d top surface of semiconductor body
10 contact elements
10a underside of contact elements
11 outer edge of recess
12 edges on underside of semiconductor bodies
13 cover body
13b upper side of cover body
13c outer surfaces cover body
13d top surface cover body
14 further cover body
14c inner surfaces of further cover bodies
14d top surface of further cover bodies
15 optoelectronic components
16 separating lines
17 further carrier
18 further foil
19 further temporary carrier
20 further auxiliary carrier
21 further auxiliary foil
22 further temporary auxiliary carrier
23 capping body
23a underside of capping body
23b upper side of capping body
23c side surfaces capping body
23d top surface capping body

DETAILED DESCRIPTION

We provide a method of producing an optoelectronic component and an optoelectronic component. The optoelectronic component is, for example, a radiation-emitting component that emits electromagnetic radiation, in particular visible light, during operation. For example, the component is a light-emitting diode.

The method may comprise the step of providing a carrier. The carrier can comprise, for example, a temporary carrier and a foil or consist of one of these elements.

If the carrier comprises a temporary carrier and a foil, the foil is arranged, for example, on an underside of the temporary carrier. The temporary carrier is then, for example, the mechanically stabilizing and supporting component of the carrier. For example, the temporary carrier is based on Si, SiC, Ge, Sapphire, GaN, GaAs, a plastic, a semiconductor material or a metal.

The foil has, for example, one or more of the following materials or consists of one of these materials: silicone, plastic, converter material.

The converter material is, for example, a luminescence conversion material provided to convert higher-energy electromagnetic radiation into lower-energy electromagnetic radiation. For example, the conversion material in particle form is introduced into a matrix material, which can be silicone or plastic.

Further, it is possible that the foil is formed from two components. The foil comprises, for example, two foils, which are each formed with different converter materials.

The foil may, for example, be formed to absorb at least a part of the radiation generated in the optoelectronic component and convert it into radiation, in particular visible light of a greater wavelength. The foil, which is a conversion foil, is formed, for example, to partially absorb and convert blue light into green, yellow and/or red light so that overall white light is emitted from the finished optoelectronic component.

The method may comprise the step of generating a plurality of recesses in the carrier. The recesses are in this example produced on an underside of the carrier. The recesses may be produced, for example, by material removal of the carrier. The material removal may be produced, for example, by a saw or a laser. Alternatively, it is possible to produce the recesses by stamping or embossing.

The method may comprise the step of applying a plurality of drops of a cover material to the carrier. The drops are applied to the underside of the carrier on which the recesses are also formed. During the application, the cover material is preferably in a liquid state. For example, during the application, a viscosity of the cover material is at least 0.1 Pa·s or at least 1 Pa·s and/or at most 10 Pa·s or at most 3 Pa·s. The cover material is preferably a silicone, in particular a clear silicone. The cover material may be formed in particular with the same material as the carrier, for example, the foil. That is to say, the carrier and the cover material may be formed from the same matrix material into which different particles may be introduced in each case.

The method may comprise the step of introducing an optoelectronic semiconductor chip comprising a semiconductor body and contact elements on an underside of the semiconductor body, into at least some, in particular all, of the drops. During the introduction, the optoelectronic semiconductor chip is, for example, centrally immersed in the cover material with an upper side facing away from the underside and pressed against the underside of the carrier with, for example, a constant pressure. In this case, the cover material is partially displaced from the underside of the carrier. In other words, as much cover material is applied, when the optoelectronic semiconductor chip is pressed onto the carrier, the cover material is pushed from the volume of the semiconductor body to the sides facing away from the side surfaces of the semiconductor body. This displacement of the cover material preferably takes place only by the application and/or pressing on the optoelectronic semiconductor chip. A precise placement of the optoelectronic semiconductor chips on the drops is achieved, for example, by a placement method (for example, so-called "pick-and-place" process).

The semiconductor body has a semiconductor layer sequence based, for example, on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$ or also an arsenide compound semiconductor material such as $Al_nIn_{1-n-m}Ga_mAs$ or $Al_nGa_mIn_{1-n-m}As_kP_{1-k}$, wherein $0 \leq n \leq 1$, $0 \leq m \leq 1$ and $n+m \leq 1$ and $0 \leq k < 1$. Preferably, $0 < n \leq 0.8$, $0.4 \leq m < 1$ and $n+m \leq 0.95$ and $0 < k \leq 0.5$ apply to at least one layer or for all layers of the semiconductor layer sequence. The semiconductor layer sequence may have dopants and additional components. For the sake of simplicity, however, only the essential components of the crystal lattice of the semiconductor layer sequence are indicated, i.e. Al, As, Ga, In, N or P, even if they can be partially replaced and/or supplemented by small quantities of further substances.

The optoelectronic semiconductor chip is formed to generate or detect electromagnetic radiation. The optoelectronic semiconductor chip is, for example, a light-emitting diode chip, or LED chip for short, or a laser diode chip. The optoelectronic semiconductor chip can emit colored light during operation, for example.

The method may comprise the step of curing the drops of the cover material into cover bodies. In the curing process, for example, the shape of an outer surface of the cover material on a side facing away from the side surfaces of the semiconductor body can be changed due to surface tensions. In this case, the change in shape is such that, for example, a widening shape of the cover body towards the upper side of the semiconductor body is automatically formed. In this case, the widening shape of the cover body does not have to be formed by an additional method step such as a removal or structuring process, rather the shape of the cover body is formed automatically due to the material properties of the cover material.

For example, a UV-curing material is used as the material for the cover material. The advantage of using UV-curing material over a thermally curing material is that there is no reduction in the viscosity of the material of the cover material due to the effect of temperature during curing of the material. UV-curing materials fully or partially polymerize at room temperature or slightly elevated temperatures. This reduces the risk that material of the cover body enters the recess and as a result, the shape of the cover body is negatively influenced, and is thus reduced.

Alternatively, it is possible to use, for example, a thermally curing material for the cover material.

Some, in particular all, of the drops may be completely surrounded by recesses in the carrier. The recesses surround the drops in lateral directions, for example, extending parallel to a main plane of extension of the carrier. The recesses are formed such that they enclose a mounting region on the carrier in a frame-like manner. The term "frame-like" is not to be understood as limiting with regard to the shape and the profile of the recess. The recesses can, for example, have a rectangular, a polygonal, a round or an oval shape. The cover material, in the form of drops is applied, for example, to at least some of the mounting regions. In this case, the drops are applied as centrally as possible to the mounting region. This means that the drops of the applied cover material are completely surrounded by the recesses.

The recesses in the carrier may act as a stop edge for the cover material during the introduction of the optoelectronic semiconductor chip. Preferably, an outer edge of the recess acts as a stop edge for the cover material. The outer edge of the recess is the edge formed by the underside of the carrier and a side surface of the recess. For the outer edge of the recess to function as a stop edge, the outer edge is preferably not rounded, but has a corner that, for example, extends at an angle of 90° or an angle of less than 90°. This means that the outer edge is sharply defined, has no rounding, no nicking or notches. Advantageously, a high positioning accuracy of the cover material may be achieved in this way, as it positions itself on the outer edge of the recess. Since the cover material is positioned itself by the recess, a particularly efficient and reproducible production of the optoelectronic component is possible.

The method of producing an optoelectronic component may comprise the provision of a carrier, in which a plurality of recesses are produced. A plurality of drops of a cover material are applied to the carrier, in which optoelectronic semiconductor chips are introduced, which comprise a semiconductor body and contact elements on an underside of the semiconductor body. The drops of the cover material are cured to form cover bodies. At least some of the drops are completely surrounded by recesses in the carrier. During introduction of the optoelectronic semiconductor chip, the recesses in the carrier act as a stop edge for the cover material.

The method of producing an optoelectronic component now makes use of the idea, inter alia, that the carrier of the optoelectronic component is provided with a plurality of recesses. In this case, the recesses act as stop edges for the displaced cover material. Due to the stop edges, it is possible to produce the outer surfaces of the cover material on the sides facing away from the side surfaces of the semiconductor body from a concave to a convex shape including all intermediate stages. Without these stop edges, only formation of the concave shape would be possible. The carrier, which is provided with recesses, facilitates the formation of the desired shape of the outer surfaces of the cover material and increases the reproducibility of the shape. In addition, the recesses in the carrier allow a homogeneous formation of the desired shape of the outer surfaces of the cover material without further measures, even when using, for example, rectangular optoelectronic semiconductor chips. The method described here therefore allows, inter alia, a particularly cost-effective production of optoelectronic components.

An edge on the underside of the semiconductor body may act as a further stop edge for the cover material. That is to say that the edge on the underside of the semiconductor body serves as a stop edge during the wetting with the cover material. So that the edge on the underside of the semiconductor body functions as a stop edge, the edge is preferably not rounded, but has a corner which, for example, extends at an angle of 90° or an angle <90°. This means that the edge is sharply defined, has no rounding, no nicking or notches. Advantageously, a high positioning accuracy of the cover material can be achieved in this way, as it positions itself at the edge on the underside of the semiconductor body.

A shape of an outer surface of the cover body may be adjustable by changing at least one of the following values: relation of the volume of the cover material to the volume of the semiconductor body, distance of a side surface of the semiconductor body to the closest recess, viscosity of the cover material, material and surface condition of the carrier. The outer surface of the cover material on the sides facing away from the side surfaces of the semiconductor body may be produced, for example, by the relation of the volume of the cover material to the volume of the semiconductor body. If, for example, the volume of the cover material is reduced while the volume of the semiconductor body remains constant, a convex shape of the outer surface of the cover material may be changed to a concave shape. By selecting the volume of the cover material, for example, all intermediate stages from concave to convex shapes may be produced.

In addition, for example, the distance between the side surface of the semiconductor body and the closest recess can be changed. If, for example, an unchanged shape of the outer surface of the cover body is desired, for example, more cover material may be applied if the distance between the side surface of the semiconductor body and the closest recess is increased. Another possibility is, for example, to increase the distance between the side surface of the semiconductor body and the closest recess, while maintaining the same relation between the volume of the cover material and the volume of the semiconductor body. For example, the convex shape of the outer surface of the cover body becomes concave as the distance increases while the quantity of cover material remains constant.

A further possibility of adjusting the shape of the outer surface of the cover body is to change the viscosity of the cover material. For example, particularly viscous cover material is applied, for example, for convexly shaped outer surfaces of the cover body. For example, particularly fluid cover material is applied, for example, for concavely shaped outer surfaces of the cover body.

In addition, the viscosity of the cover body may be used to adjust the position accuracy of the optoelectronic semiconductor chip. An increase in the viscosity may be counteract, for example, the cover material to flow apart before curing so that the introduced optoelectronic semiconductor chip remains on the introduced position and is not washed away from the introduced position by the cover material flowing apart.

In addition, the shape of the outer surface of the cover material may be adjustable by the selection of the material of the carrier and the surface condition thereof. If the carrier has, for example, a rough surface, the displaced cover material wets the carrier less well up to the stop edge of the recess compared to a smooth surface of the carrier. This means that the rough surface is, for example, better suited to adjust the convex shape of the outer surface of the cover material. The concave shape of the outer surface of the cover material may be adjusted, for example, by the smooth surface of the carrier.

The recesses may partially penetrate the carrier. This is to say, in the region of the recesses, the carrier is only removed up to a specific depth. The bottom surface of the recess is then formed by regions of the carrier, which are not removed. In this case, it is in particular possible that the recesses do not penetrate the carrier at any point. The carrier is then only partially removed and not penetrated by the recess. For example, only one foil of the carrier can be completely penetrated and the auxiliary carrier is free of recesses. Furthermore, it is possible that material of the foil is removed only up to a specific depth in the region of the recesses.

In addition, the recess is free of the cover material at least in places. This is to say that the cover material does not enter through the stop edge, which is formed by the recess, in at least some places of the recesses. Preferably, the recess is free or substantially free of the cover material. In this case, substantially free means that small quantities of material of the cover material may enter the recess due to the production process. In particular, a bottom surface of the recess is preferably free of the cover material. This is to say that under certain circumstances, cover material may be present on the side surfaces of the recess, which delimit the recess, but the recess is not filled with the cover material and thus at least in places, preferably completely free of the cover material.

The recesses may completely penetrate the carrier. That is to say that the carrier is then completely removed and penetrated by the recess. Furthermore, the side surfaces of the recesses that completely penetrate the carrier are free of the cover material at least in places. This is to say that the cover material does not enter through the stop edge, which is formed by the recess, in at least some places of the recesses. In this example, substantially free means that small quantities of material of the cover material may enter the recess due to the production process, but is substantially free of the cover material.

A further cover body may be arranged on the outer surfaces of the cover body, on the underside of the semiconductor body and on an underside of the carrier. The further cover body is in direct and full-surface contact with the outer sides of the cover body on the sides facing away from the side surfaces of the semiconductor body. In addition, the further cover body is arranged on the underside of the semiconductor body. In this example, the further cover body covers a side surface of the contact elements on the underside of the semiconductor body, preferably in direct and full-surface contact with the side surfaces of the contact elements. The further cover body is arranged, for example, such that an underside of the contact elements facing away from the semiconductor body is free of the further cover body. Furthermore, the contact elements may be exposed by grinding back the further cover body so that the underside of the contact elements is exposed.

When the carrier projects laterally beyond the semiconductor chip and the cover body, the further cover body is also attached to a top surface of the underside of the carrier, which is not covered by a top surface on the upper side of the semiconductor body and a top surface on the upper side of the cover body. The further cover body is preferably in direct and full-surface contact with the underside of the carrier. If the carrier has any recesses, the side surfaces and bottom surfaces of the recesses are likewise covered by the further cover body. If the recesses penetrate completely through the carrier, for example, the further cover body terminates flush with the upper side of the carrier and covers the side surfaces of the carrier completely and is preferably in direct and full-surface contact with these.

The further cover body is formed to be reflective, for example, for the radiation emitted by the semiconductor chip. The further cover body may be formed, for example, by a plastic or silicone filled with radiation-scattering and/or radiation-reflecting particles. The material of the further cover body is, for example, a silicone, which is filled with titanium oxide particles. In addition, the carrier, which comprises, for example, the foil, the cover body and the further cover body may be formed with the same material. As a result, the various components can adhere particularly well to one another.

The carrier may be detached from the optoelectronic semiconductor chip. The detachment process may include, for example, a plurality of intermediate steps. For example, a temporary auxiliary carrier may be arranged to the underside of the semiconductor chip, for example, to the underside of the contact elements, and the carrier with recesses may be removed. That is to say that the upper side of the semiconductor chips and the upper side of the cover bodies are free of the carrier. The temporary auxiliary carrier is, for example, the mechanically stabilizing and supporting component of the optoelectronic components during the detachment process of the carrier from the optoelectronic semiconductor chips.

A further carrier may be applied to an upper side of the optoelectronic semiconductor chip facing away from the underside. The further carrier is applied to the upper side of the optoelectronic semiconductor chip, for example, before the second cover body is applied. The carrier has no recesses and completely covers the upper side of the semiconductor chips. That is to say that the further cover body, which is applied, for example, after this step, terminates flush with the upper side of the cover body. The further carrier comprises, for example, a further temporary carrier and a further foil. The further foil is arranged, for example, on an underside of the temporary carrier.

In addition, an optoelectronic component is provided. The optoelectronic component is produced, for example, using a method as described in connection with one or more of the above-mentioned examples. All features of the method are therefore also disclosed for the optoelectronic component and vice versa.

The optoelectronic component may comprise an optoelectronic semiconductor chip comprising a semiconductor body and contact elements on an underside of the semiconductor body. The optoelectronic semiconductor chip is formed to generate or detect electromagnetic radiation. The optoelectronic semiconductor chip is, for example, a light-emitting diode chip, short LED chip or a laser diode chip or a photodiode chip. The contact elements have, for example, a metal or consist thereof.

The optoelectronic component may comprise a cover body formed with a radiation-transmissive material. In this example, the radiation-transmissive material is formed, for example, transparently for the radiation generated by the optoelectronic semiconductor chip. For example, the radiation-transmissive material is formed from a silicone, in particular a clear silicone.

The cover body may cover side surfaces of the semiconductor body. The cover body is in direct contact with the semiconductor body and recasts the semiconductor body at its side surfaces.

The cover body may terminate flush with the underside of the semiconductor body. That is to say that the cover body does not project beyond the underside of the semiconductor body. The cover body or cover material does not extend, for example, onto the underside of the semiconductor body at least in some places due to the stop edge on the underside of the semiconductor body. The underside of the semiconductor body is preferably free or substantially free of the cover material. In this example, substantially free means that small quantities of material of the cover material may extend on the underside of the semiconductor body due to the production process.

The cover body may wet the semiconductor body at least in places on an upper side facing away from the underside. In this case, the upper side of the semiconductor body has residues of the cover body or the cover material. A top surface on the upper side of the semiconductor body has production-related elevations and depressions on the micro- and nanometer scale. For example, residues of the cover body or the cover material are present in places in these production-related trenches. The production-related trenches, that are filled with residues of the cover body or cover material, are, for example, continuously connected to one another. That is to say that the cover material not displaced by the semiconductor body at the top surface at the upper side of the semiconductor body wets the top surface of the semiconductor body at least in places.

An outer surface of the cover body may extend in a curved manner on a side facing away from the side surfaces of the semiconductor body. The shape of the cover body widens towards the upper side of the semiconductor body through the curved shape. In this example, the cover body is shaped convexly or concavely on the side facing away from the side surfaces of the semiconductor body, for example. Alternatively, the cross section of the cover body can be triangular, for example.

A thickness of the cover body on the upper side of the semiconductor body may be at most 3 µm. The small thickness of the cover body provides, for example, a good thermal connection between the optoelectronic semiconductor chip and, if present, the capping body. In addition, the cover body on the upper side of the semiconductor body protects the semiconductor body, for example, from chemical damage.

A capping body may cover the semiconductor body and the cover body. The capping body may, for example, comprise and/or consist of one or more of the following materials: glass, silicone, in particular clear silicone, plastic, converter material. Alternatively or additionally, the capping body may partially or completely absorb the radiation of the semiconductor chip and convert it into radiation of another wavelength range. The radiation emitted from the cover body, which is at least partially converted, may then be light in the visible range, in particular white light, for example.

The cover body may provide an adhesion of the semiconductor body and the capping body. In this example, the cover body adheres to the lateral surfaces of the semiconductor body and to an underside of the capping body. In addition, non-displaced cover material is present between the upper side of the semiconductor body and the underside of the capping body, which likewise provides the adhesion of the semiconductor body and the capping body. The composite of semiconductor body and capping body is thus particularly strong.

A further cover body may at least partially cover the cover body, the semiconductor chip and/or the capping body, and the further cover body may be formed to be reflective for electromagnetic radiation. The further cover body is formed to be reflective, for example, for the radiation emitted by the semiconductor chip. The further cover body may be formed, for example, by a plastic filled with radiation-scattering and/or radiation-reflecting particles. The material of the further cover body is, for example, a silicone filled with titanium oxide particles.

The further cover body may terminate flush with the contact elements on the side facing away from the semiconductor body. The further cover body is thus in direct contact with the underside of the semiconductor body, which is not covered by the contact elements. This is to say that a radiation emitted by the semiconductor chip in the direction of the contacts can then be reflected by the further cover body in the direction of the upper side of the capping body. Advantageously, this increases the coupling-out of light from the optoelectronic component.

The capping body may project laterally beyond a top surface of the semiconductor body and a top surface of the cover body or terminate laterally flush with the top surface of the cover body. The top surfaces of the semiconductor body and the cover body are arranged on the upper sides thereof. If the capping body terminates laterally flush with the top surface of the cover body, the further cover body laterally surrounds the capping body and terminates flush with an upper side of the capping body. A radiation emitted or scattered by the semiconductor chip, which radiation is emitted or scattered in the direction of the capping body side can then be reflected back again in the direction of the upper side of the capping body via the further cover body. Advantageously, a high beam density is thus generated.

If the capping body projects beyond the top surface of the semiconductor body and the top surface of the cover body, the further cover body, for example, terminates laterally flush with the capping body. Thus, the radiation generated and emitted in the semiconductor body also exits the optoelectronic component at the side surfaces of the capping body. Advantageously, a high light output is thus generated.

The capping body, which is not covered by the top surface of the semiconductor body and the cover body, may have recesses on a side facing the cover body. The recess on the underside of the capping body penetrates the capping body only partially, for example. The recess is, for example, completely filled with the further cover material. A bottom surface on the underside and a side surface of the recess are, for example, completely covered with the further cover body. In this way, a high beam density and a high output of light are advantageously generated.

The contact elements may be freely accessible. Due to the flush termination of the further cover body with the contact elements, the undersides of the contact elements are exposed on the side facing away from the underside of the optoelectronic semiconductor chip. These exposed contact elements may be electrically and/or mechanically contacted, for example, via a further carrier.

In the following, a method and an optoelectronic component are explained in more detail with reference to the Figures on the basis of examples.

An example of a production method of optoelectronic components 15 is described and shown in connection with FIGS. 1A to 1F.

Figure 1A:
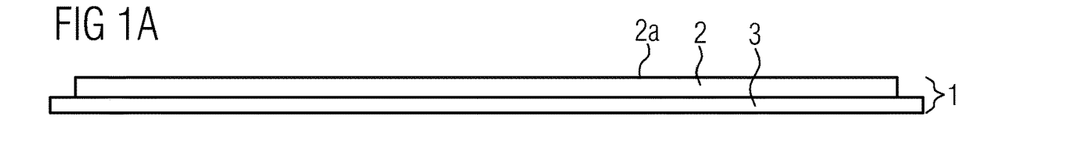
FIGS. 1A, 1B, 1C, 1D, 1E, 1F, 2A, 2B, 2C, 2D, 2E, 2F, 2G, 2H, 3A, 3B, 3C, 3D and 3E show schematic sectional representations of method steps of an example of our method of producing an optoelectronic component.

According to FIG. 1A, a carrier 1 is provided in a first method step. The carrier 1 comprises, for example, a foil 2, preferably a conversion silicone foil arranged on a temporary carrier 3, for example, a metal plate. The conversion silicone foil comprises, for example, a conversion material, which is introduced in particle form in a matrix material, for example, silicone.

Figure 1B:
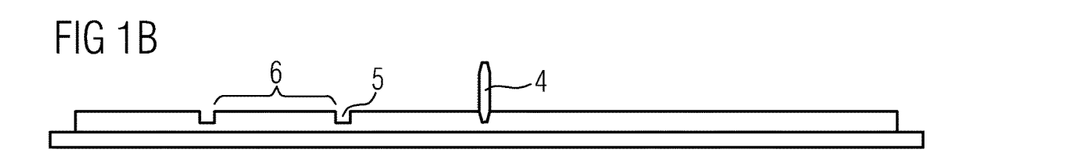

According to FIG. 1B, in a next method step, a plurality of recesses 5 are produced on the underside of the foil 2a. The material removal is produced, for example, by a saw blade 4 on the underside of the foil 2a. The saw blade 4 is, for example, only partially inserted into the foil 2 so that the recesses 5 only partially penetrate the foil 2. The recesses 5 produced in this way produce, for example, a square grid on the foil 2. In addition, the patterns may also have other shapes. These may be rectangular, polygonal, round or oval. To produce round or oval shapes, the recesses may be produced by a laser beam in particular. Alternatively, it is possible to produce the recesses by stamping or embossing. The recesses 5 each frame a mounting region 6.

Figure 1C:
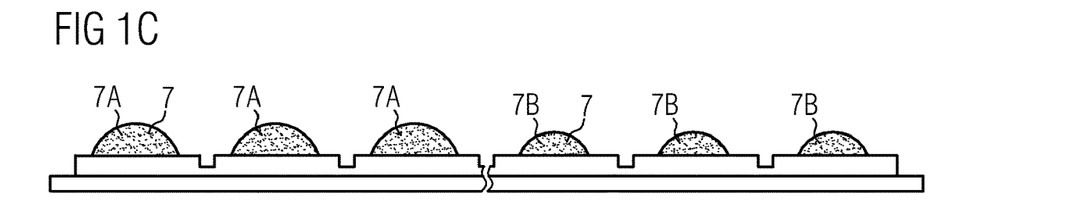

According to FIG. 1C, in a next method step, drops of a cover material 7 are applied to at least some, in particular all, of the mounting regions 6. In this case, two carriers 1 are shown, for example, onto each of which drops of the cover material 7 are applied. The cover material 7 is advantageously liquid. The cover material 7 is applied, for example, in a quantity A or B to the mounting regions 6 of the respective carrier 1. The cover material 7 of the quantity A and B has, for example, the same viscosity. For example, the quantity A of the cover material 7A is greater than the quantity B of the cover material 7B. Due to the different quantities A and B, different shapes of the outer surfaces of the cover material 7c on the sides facing away from the side surfaces of the semiconductor body 9c are produced in the further method steps. This is shown by way of example by the two carriers 1. The cover material 7 is preferably a silicone, in particular a clear silicone.

Figure 1D:
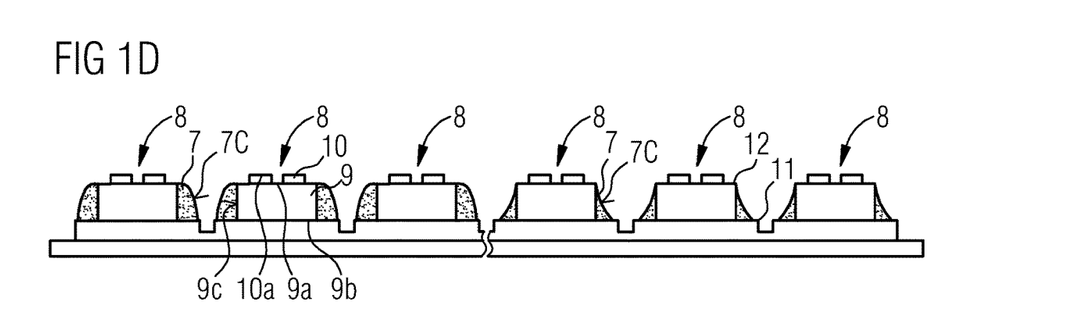

According to FIG. 1D, in a next method step, optoelectronic semiconductor chips 8, comprising a semiconductor body 9 and contact elements 10 on the underside of the semiconductor body 9a, are introduced into at least some of the drops. In this example, the optoelectronic semiconductor chips 8 are placed on the cover material 7 with an upper side 9b ahead and pressed with a defined pressure in the direction of the underside of the foil 2a. In this example, the cover material 7 is partially displaced from the semiconductor body 9 from the underside of the foil 2a. The outer edges of the recesses 11 and the edges on the underside of the semiconductor bodies 12 act as stop edges for the displaced cover material. This is to say that a wetting of the underside of the foil 2a and the semiconductor body side surfaces 9c ends at these stop edges.

The shape of the cover material 7 laterally surrounds the semiconductor body and depends, for example, on the quantity of the cover material 7 applied. According to FIG. 1D, the shape of the outer surfaces of the cover material 7c on the sides facing away from the side surfaces of the semiconductor body 9c is convex for the quantity A of the cover material 7A. For an amount B of the cover material 7B, which is smaller than the quantity A of the cover material 7A, the outer surfaces of the cover material 7c are shaped concavely on the sides facing away from the side surfaces of the semiconductor body 9c.

In a further step, in a next method step, the drops of the cover material 7 are cured to form cover bodies 13.

Figure 1E:
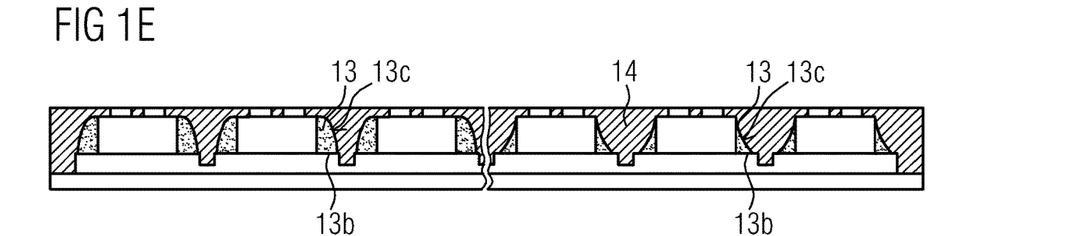

According to FIG. 1E, in a next method step, the further cover body 14 is arranged on the outer surfaces of the cover body 13c, on the underside of the semiconductor body 9a and on the underside of the foil 2a, for example, by an injection molding method. Optionally, the contact elements 10 are exposed, for example, by grinding back the further cover body 14.

Figure 1F:
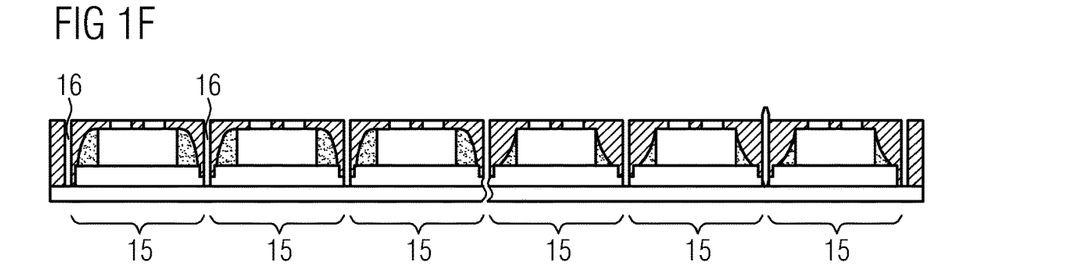

According to FIG. 1F, in a next method step, the optoelectronic components 15 are separated along separating lines 16 through the further cover body 14 and the foil 2 so that individual optoelectronic components 15 are produced.

FIGS. 2A to 2H show further schematic sectional representations of method steps of an example for a production method for optoelectronic components 15.

Figure 2A:
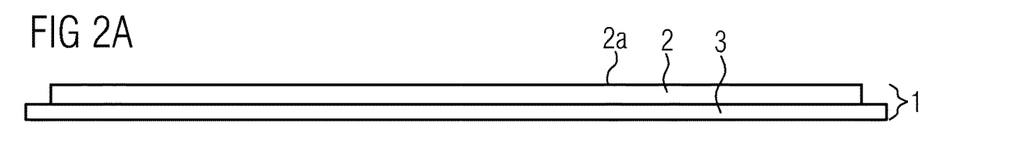

According to FIG. 2A, a carrier 1 is provided in a method step. The carrier comprises, for example, a foil 2, in particular a temporary foil arranged on a temporary carrier 3.

Figure 2B:
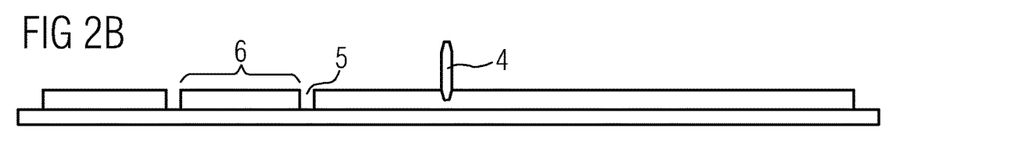

According to FIG. 2B, in a next method step, a plurality of recesses 5 are produced on the underside of the foil 2a. The material removal is produced, for example, by a saw blade 4 on the underside of the foil 2a. The saw blade 4 is completely immersed in the foil so that the recesses 5 completely penetrate the foil 2. The recesses 5 produced in this way produce, for example, a square grid on the foil 2. In addition, the patterns may also have other shapes. These may be rectangular, polygonal, round or oval. The recesses 5 each frame a mounting region 6.

Figure 2C:
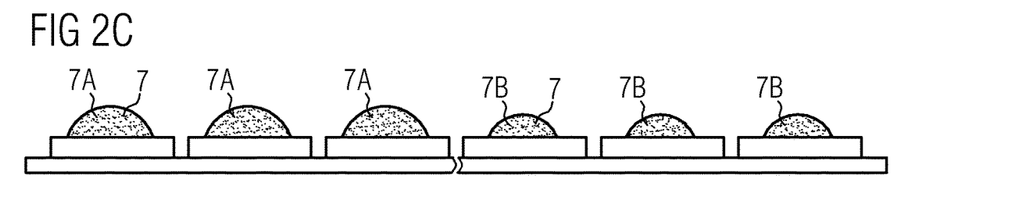
Figure 2D:
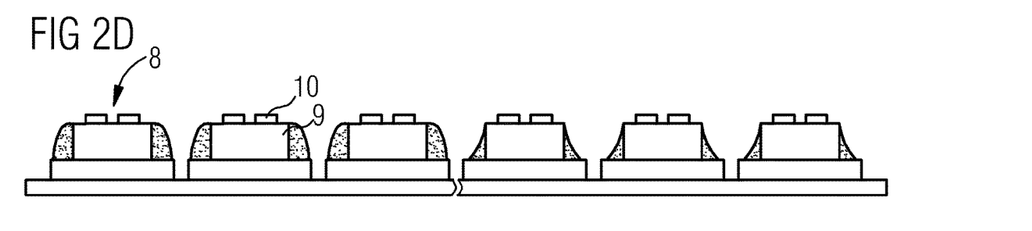

According to FIGS. 2C and 2D, further method steps are shown analogous to those in FIGS. 1C and 1D.

Figure 2E:
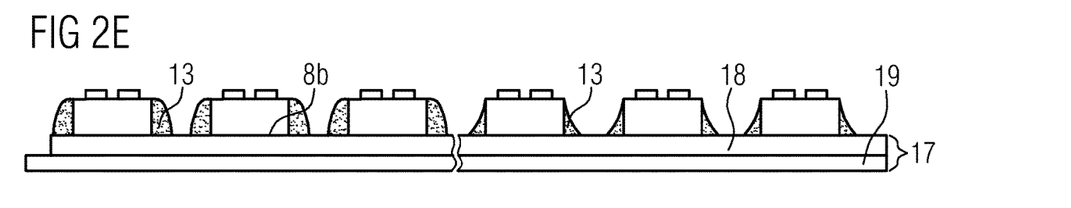

According to FIG. 2E, in a next method step, the carrier 1 is detached from the optoelectronic semiconductor chips 8. The detachment process may, for example, include a plurality of intermediate steps. For example, a further temporary auxiliary carrier is attached to an underside of the contact elements 10a (not shown) and the carrier 1 having recesses 5 as shown in FIG. 2B, is removed. That is to say that the upper side of the semiconductor chips and the upper side of the cover bodies are free of the carrier. After detachment, a further carrier 17 may be applied to an upper side of the optoelectronic semiconductor chip 8b facing away from the underside. The further carrier 17 comprises, for example, a further foil 18, in particular, a further temporary foil, on a further temporary carrier 19.

Figure 2F:
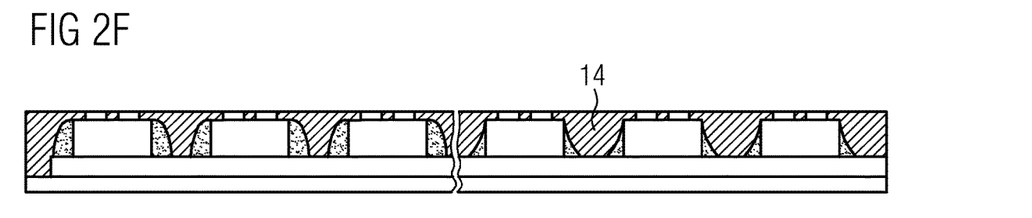

According to FIG. 2F, a next method step is analogous to the method step described in FIG. 1E. Through the further carrier 17, which is applied in the method step according to FIG. 2E, and which has no recesses 5, the applied further cover body 14 terminates flush with the upper side of the cover body 13b.

Figure 2G:
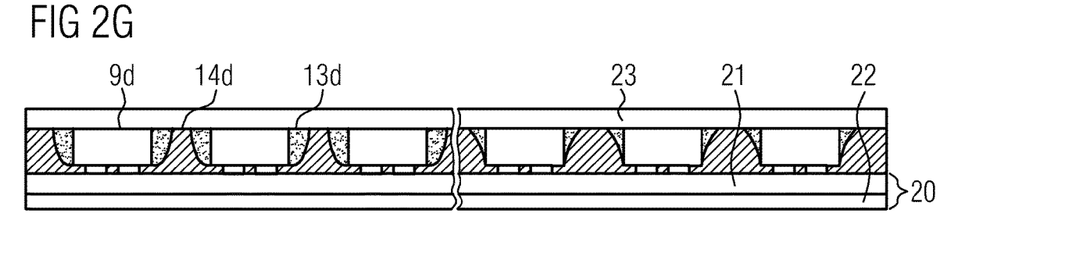

According to FIG. 2G, in a next method step, a further auxiliary carrier 20, which comprises, for example, a further auxiliary foil 21, in particular a further temporary auxiliary foil on a further temporary auxiliary carrier 22, is attached to the underside of the contact elements 10a. An upper side of the further auxiliary foil 21 is in direct contact with the underside of the contact elements 10a. The further carrier 17, which is applied in the step according to FIG. 2E, is removed and a cover body 23, for example, a conversion layer, is applied to the top surfaces of the semiconductor body 9d, to the top surfaces of the cover body 13d and to the top surfaces of the further cover body 14d. The conversion layer is applied, for example, by laminating, spraying, screen printing or stencil printing.

Figure 2H:
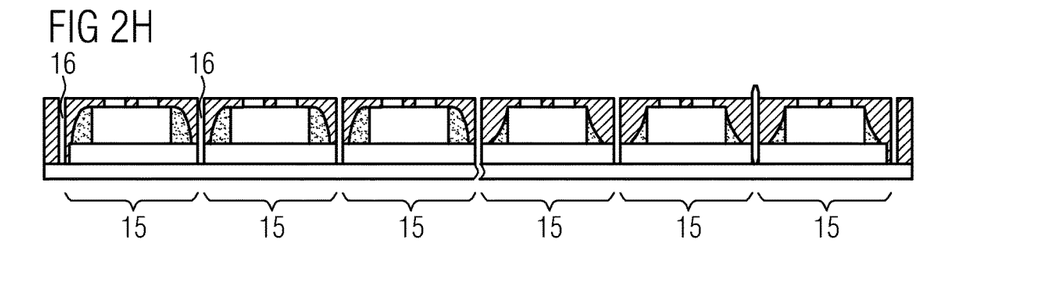

According to FIG. 2H, in a next method step, the optoelectronic components 15 are separated along separating lines 16 through the further cover body 14 and the conversion silicone foil so that individual optoelectronic components 15 are produced.

In connection with FIGS. 3A to 3E, a further example of a production method for optoelectronic components is described.

According to FIGS. 3A to 3D, further method steps are shown analogous to those in FIGS. 2A to 2D.

Figure 3A:
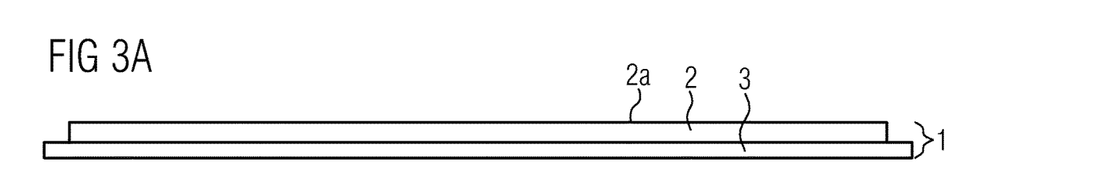
Figure 3B:
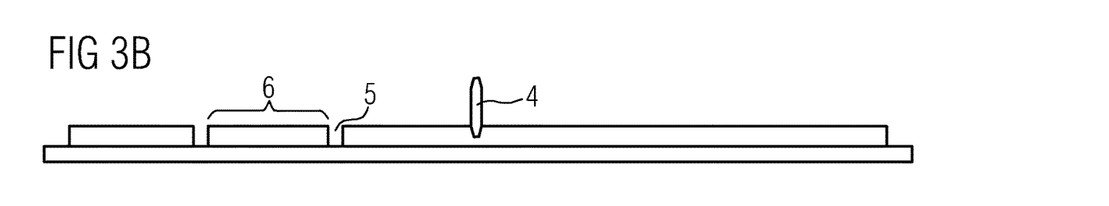
Figure 3C:
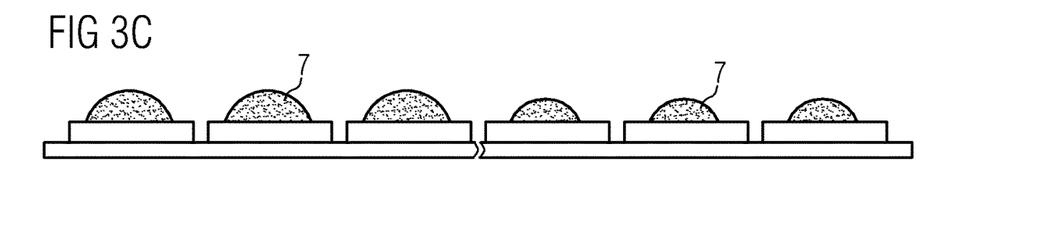
Figure 3D:
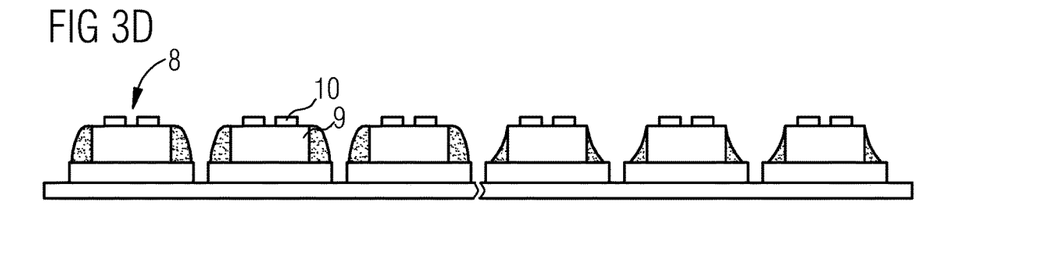
Figure 3E:
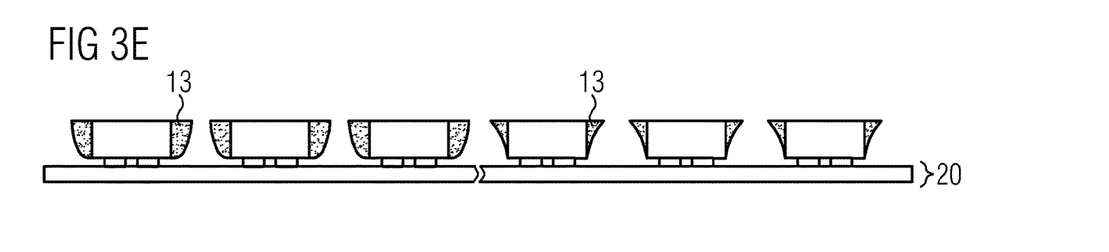

According to FIG. 3E, in a next method step, a further auxiliary carrier 20 is attached to the underside of the contact elements 10a and the carrier 1, which has recesses 5 according to the step of FIG. 2B, is removed. An upper side of the further auxiliary carrier 20 is in direct contact with the underside of the contact elements 10a. The optoelectronic components 15 can be separated, for example, by detaching them from the further auxiliary carrier 20.

FIGS. 4A to 4L each show an example of an optoelectronic component 15 which, for example, is at least partially produced with the method steps described in connection with the examples of FIGS. 1A to 1F, 2A to 2H and 3A to 3E.

The optoelectronic component 15 has an optoelectronic semiconductor chip 8, comprising a semiconductor body 9 and contact elements 10 on an underside of the semiconductor body 9a. The cover body 13 formed with a radiation-transmissive material, covers the side surfaces of the semiconductor body 9c. The cover body 13 is formed, for example, from silicone, in particular, clear silicone.

Figure 4A:
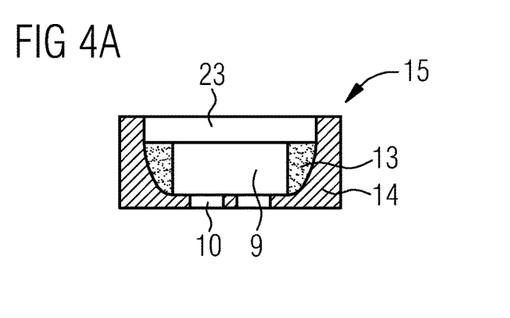
FIGS. 4A, 4B, 4C, 4D, 4E, 4F, 4G, 4H, 4I, 4J, 4K and 4L show schematic sectional representations of examples of our optoelectronic component.
Figure 4B:
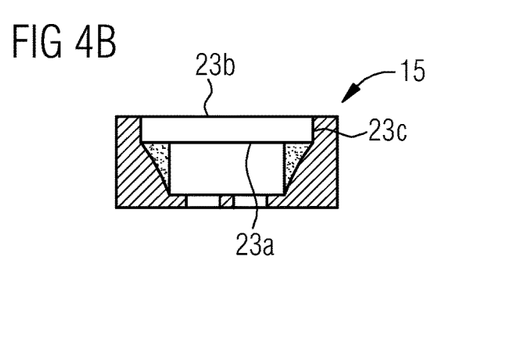
Figure 4C:
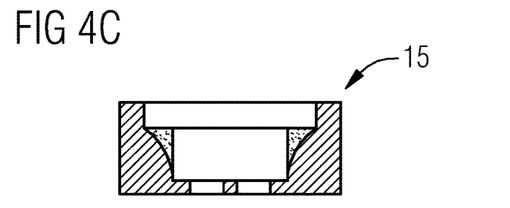
Figure 4D:
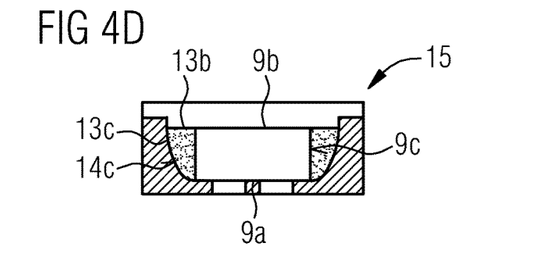
Figure 4E:
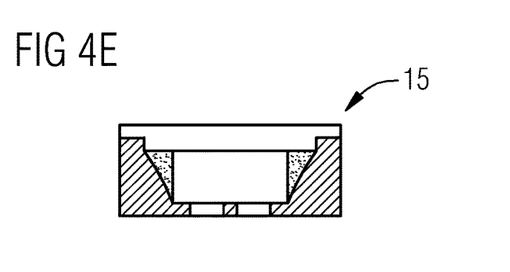
Figure 4F:
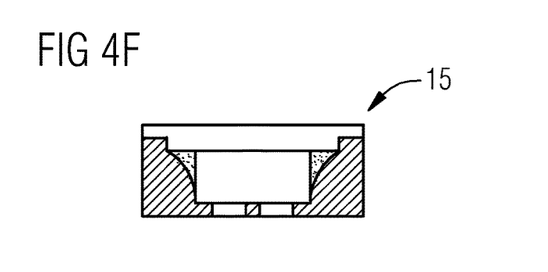
Figure 4G:
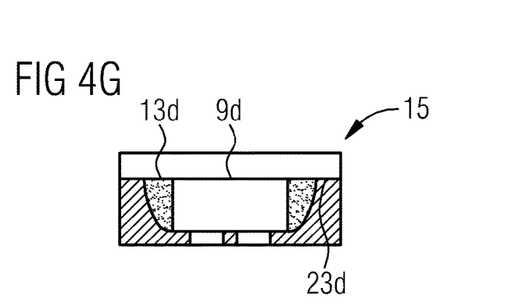
Figure 4H:
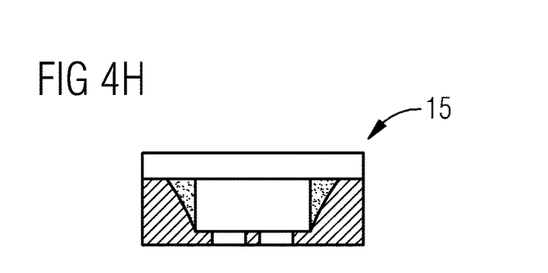
Figure 4I:
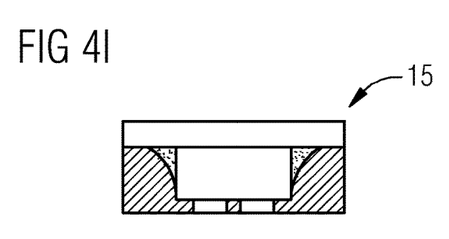

FIGS. 4A, 4D, 4G and 4J show examples of the optoelectronic component 15, in which the outer surfaces of the cover body 13c are shaped convexly on the sides facing away from the side surfaces of the semiconductor body 9c. The examples shown in FIGS. 4A, 4D and 4G are surrounded by a further cover body 14 formed to be reflective for the radiation emitted by the optoelectronic semiconductor chip 8. The shape of the inner surface of the further cover body 14c corresponds to the shape of the outer surface of the cover body 13c on the sides facing away from the side surfaces of the semiconductor body 9c. This is to say that for the examples shown in FIGS. 4A, 4D and 4G, the inner surfaces of the further cover body 14c are shaped convexly. Advantageously, this shape provides the highest reflectivity for the radiation emitted by the optoelectronic semiconductor chip 8.

FIGS. 4B, 4E, 4H and 4K show examples of the optoelectronic component 15 in which the outer surfaces of the cover body 13c are triangular shaped in a cross section on the sides facing away from the side surfaces of the semiconductor body 9c. The examples shown in FIGS. 4B, 4E and 4H have the further cover body 14. This is to say that the inner surfaces of the further enveloping body 14c are also triangular shaped in cross section.

FIGS. 4C, 4F, 4I and 4L show examples of the optoelectronic component 15 in which the outer surfaces of the cover body 13c are shaped concavely on the sides facing away from the side surfaces of the semiconductor body 9c. The examples shown in FIGS. 4C, 4F and 4I have a further cover body 14. This is to say that the inner surfaces of the further cover body 14c are also concave. This shape may be produced in a particularly simple and cost-effective manner.

FIGS. 4A, 4B and 4C show examples of the optoelectronic component 15, which have the further cover body 14 covering the side surfaces of the capping body 23c and the further cover body 14 terminates flush with the upper side of the capping body 23b. In this example, the upper side of the cover body 13b terminates flush with the capping body 23.

In FIGS. 4D, 4E, 4F, 4G, 4H and 4I, the optoelectronic components 15 have the further cover body 14 that covers the underside of the capping body 23a. In this example, the capping body 23 projects laterally beyond the top surface of the cover body 13d on the upper side of the cover body 13b.

In the examples shown in FIGS. 4D, 4E and 4F, the top surfaces of the capping body 23d on the underside of the capping bodies 23a, which are not covered by the top surface of the upper side of the semiconductor body 9d and the upper side of the cover body 13d, have recesses 5 on the side facing the cover body 13. The recesses 5 are completely filled with the further cover body 14.

Figure 4J:
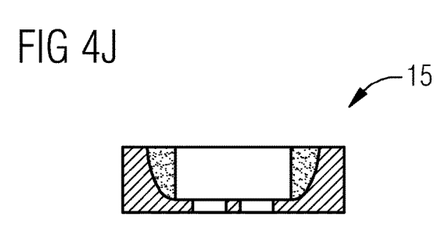
Figure 4K:
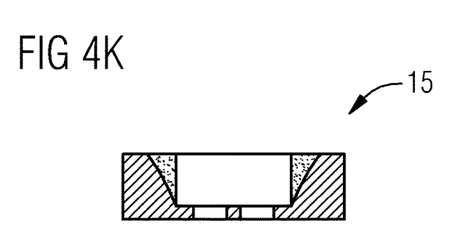
Figure 4L:
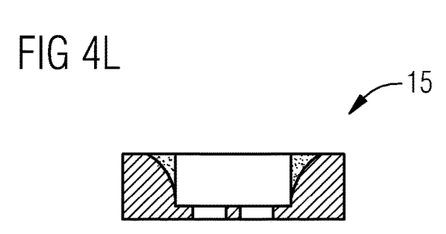

In the examples shown in FIGS. 4J, 4K and 4L, the optoelectronic components 15 have no further cover body 14 and no capping body 23. These optoelectronic components 15 can be mounted and/or inserted in and/or on various carriers and/or housings.

Priority of DE 102017128717.5 is claimed, the subject matter of which is expressly incorporated herein by reference.

The methods and components described herein are not limited by the description on the basis of the examples. Rather, this disclosure includes each new feature and each combination of features, which includes in particular each combination of features in the appended claims, even if the feature or combination itself is not explicitly indicated in the claims or examples.

What is claimed is:

1. A method of producing an optoelectronic component comprising:
    providing a carrier,
    generating a plurality of recesses in the carrier,
    applying a plurality of drops of a cover material to the carrier,
    introducing an optoelectronic semiconductor chip comprising a semiconductor body and contact elements on an underside of the semiconductor body into at least some of the drops, and
    curing the drops of the cover material into cover bodies, wherein
    at least some of the drops are completely surrounded by recesses in the carrier,
    the recesses in the carrier are a stop edge for the cover material during introduction of the optoelectronic semiconductor chip, and
    a shape of an outer surface of the cover material is the same on each side of the optoelectronic semiconductor chip after the semiconductor chip is introduced.

2. The method according to claim 1, wherein an edge on the underside of the semiconductor body is a further stop edge for the cover material.

3. The method according to claim 1, wherein a shape of an outer surface of the cover body is adjustable by changing at least one value: relation of volume of the cover material to volume of the semiconductor body, distance of a side surface of the semiconductor body to the closest recess, viscosity of the cover material, material and surface condition of the carrier.

4. The method according to claim 1, wherein the recesses partially penetrate the carrier.

5. The method according to claim 1, wherein the recesses completely penetrate the carrier.

6. The method according to claim 1, wherein a further cover body is arranged on the outer surfaces of the cover body, on the underside of the semiconductor body and on an underside of the carrier.

7. The method according to claim 1, wherein the carrier is detached from the optoelectronic semiconductor chip.

8. The method according to claim 1, wherein a further carrier is applied to an upper side of the optoelectronic semiconductor chip facing away from the underside.

9. The method according to claim 1, wherein a recess is arranged between all directly adjacent drops.

10. The method according to claim 1, wherein the drops are not in direct contact to every stop edge during application of the drops.

* * * * *